United States Patent [19]

Okayasu

[11] Patent Number: 5,942,902

[45] Date of Patent: *Aug. 24, 1999

[54] METHOD OF MEASURING DELAY TIME AND RANDOM PULSE TRAIN GENERATING CIRCUIT USED IN SUCH METHOD

[75] Inventor: Toshiyuki Okayasu, Tokyo, Japan

[73] Assignee: Advantest Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/762,819

[22] Filed: Dec. 9, 1996

[30] Foreign Application Priority Data

Dec. 21, 1995 [JP] Japan ................................. 7-333151

[51] Int. Cl.$^6$ ................................................. G01R 27/28
[52] U.S. Cl. ......................................... 324/617; 324/614
[58] Field of Search ..................................... 324/617, 614; 307/31, 119; 328/59; 348/536, 518, 180, 192; 327/262, 164

[56] References Cited

U.S. PATENT DOCUMENTS

| | | | |
|---|---|---|---|
| 3,622,905 | 11/1971 | Brown | 331/78 |
| 3,648,080 | 3/1972 | Nakaya | 327/31 |
| 3,758,873 | 9/1973 | Miller | 331/78 |
| 3,866,128 | 2/1975 | Fletcher | 328/59 |
| 4,805,021 | 2/1989 | Harlos | 348/536 |
| 4,814,689 | 3/1989 | Obara | 324/617 |
| 5,216,301 | 6/1993 | Gleeson | 307/595 |

FOREIGN PATENT DOCUMENTS

| | | |
|---|---|---|
| 43 39 669 | 5/1995 | Germany . |
| 5-256922 | 10/1993 | Japan . |
| 7-20204 | 1/1995 | Japan . |

*Primary Examiner*—Josie Ballato
*Assistant Examiner*—Thomas Valone
*Attorney, Agent, or Firm*—Oblon, Spivak, McClelland, Maier & Neustadt, P.C.

[57] ABSTRACT

A delay time of a delay time generating circuit which delays an inputted pulse signal for a predetermined time and outputs the delayed pulse signal is measured. A random pulse generating circuit for outputting a train of pulses at random intervals is provided, and an output signal of the delay time generating circuit is applied to an input signal thereof through a positive feedback loop. An output signal is applied from the random pulse generating circuit to the positive feedback loop to cause the positive feedback loop to oscillate, and a delay time of the delay time generating circuit is determined from a period at which the positive feedback loop oscillates. The delay time can accurately be measured without being affected by an interference caused by another signal or a disturbance brought about by noise.

2 Claims, 3 Drawing Sheets

A SAMPLE OF WAVEFORM SHAPER

A SAMPLE OF WAVEFORM SHAPER

METHOD OF MEASURING DELAY TIME AND RANDOM PULSE TRAIN GENERATING CIRCUIT USED IN SUCH METHOD

BACKGROUND OF THE INVENTION

1. Field of the Invention

The present invention relates to a delay time generating circuit for use in an IC test system, and more particularly to a method of measuring a delay time which is carried out in calibrating a delay time generating circuit and a random pulse train generating circuit for use in such a method.

2. Description of the Related Art:

As shown in FIG. 1 of the accompanying drawings, a conventional delay time generating circuit 21 comprises n variable-delay circuits 22 whose delay time is established by binary data and n selectors 23 for selecting the respective variable-delay circuits 22. Each of the selectors 23 selects one of input signals supplied to its two respective terminals, e.g., a terminal A and a terminal B, in response to a selection control signal Sc transmitted from a controller (not shown), and outputs the selected the input signal from a terminal X thereof. The terminal A of each of the selectors 23 is supplied with an output signal directly from a preceding circuit, and the terminal B thereof is supplied with the same output signal through the corresponding variable-delay circuit 22. When the selectors 23 are selectively operated, corresponding variable-delay circuits 22 which have desired delay times, among all the n variable-delay circuits 22, are connected in series with each other, setting the entire delay time generating circuit 21 to a certain total delay time. The delay times of the variable-delay circuits 22 are determined by calibration data transmitted from the controller.

The delay time generating circuit 21 produces an output signal SO which is applied back to an input signal SIN thereof through a positive feedback loop comprising an AND gate 26, an OR gate 25, and a waveform shaper 24.

The AND gate 26 is supplied with a loop signal for turning on or off the positive feedback loop, as an input signal in addition to the output signal SO. The OR gate 25 is supplied with a start pulse for triggering the positive feedback loop to oscillate, as an input signal in addition to the output signal SO supplied as an output signal from the AND gate 26.

When a loop signal of a high level (logic "1") is supplied to the AND gate 26 and a single start pulse is supplied to the OR gate 25, an output signal SO of the delay time generating circuit 21 is applied to an input signal SIN thereof, causing the positive feedback loop to start to oscillate. Since the positive feedback loop oscillates at an oscillation period equal to the delay time of one cycle of the positive feedback loop, it is possible to determine the delay times of the variable-delay circuits 22 by determining the oscillation periods of output signals SO which are produced when the variable-delay circuits 22 are selected one at time, determining the oscillation period of an output signal SO which is produced when no variable-delay circuit 22 is selected, and calculating the differences between those oscillation periods. After the delay time of the variable-delay circuits 22 is determined, the loop signal is set to a low level (logic "0") to cause the positive feedback loop to stop oscillating. The variable-delay circuits 22 are calibrated based on the delay times that are thus determined.

With the above conventional method of measuring the delay times, however, if a periodic noise source such as a system clock is present close to the delay time generating circuit 21 and if the ratio between the period of the noise produced by the periodic noise source and the oscillation period of the positive feedback loop is close to an integer, then the positive feedback loop tends to oscillate unstably, resulting in a fluctuation in the oscillation period thereof. As a result, the delay times of the variable-delay circuits 22 cannot accurately be measured.

SUMMARY OF THE INVENTION

It is therefore an object of the present invention to provide a method of measuring a delay time accurately without being affected by an interference caused by another signal or a disturbance brought about by noise.

Another object of the present invention is to provide a random pulse train generating circuit for use in such a method.

According to the present invention, there is provided a method of measuring a delay time of a delay time generating circuit which delays an inputted pulse signal for a predetermined time and outputs the delayed pulse signal, comprising the steps of providing a random pulse generating circuit for outputting a train of pulses at random intervals, applying an output signal of the delay time generating circuit to an input signal thereof through a positive feedback loop, applying an output signal from the random pulse generating circuit to the positive feedback loop to cause the positive feedback loop to oscillate, and determining a delay time of the delay time generating circuit from a period at which positive feedback loop oscillates.

According to the present invention, a random pulse train generating circuit for use in the above method comprises a random pulse oscillator for generating a train of pulses at random intervals, a gate circuit for controlling the passage of the train of pulses outputted from the random pulse oscillator, and a gate pulse generator for outputting a gate pulse to open the gate circuit to pass the train of pulses outputted from the random pulse oscillator, the random pulse oscillator comprising a noise source, a differential amplifier for extracting a noise signal from an output signal of the noise source, a comparator for shaping an output signal from the differential amplifier into a pulse, a pulse-duration setting circuit for converting the pulse outputted from the comparator into a pulse having a predetermined duration, and a pulse-density adjusting circuit having adjusting means for supplying an output signal from the pulse-duration setting circuit to the noise source through a negative feedback loop thereby enabling the pulse-duration setting circuit to output a train of pulses at random intervals, and adjusting the quantity of the signal through the negative feedback loop to adjust the density of the trail of pulses.

With the above method of measuring a delay time of a delay time generating circuit, an output signal from the delay time generating circuit is applied to an input signal thereof through the positive feedback loop, and an output signal from the random pulse generating circuit to the positive feedback loop to cause the positive feedback loop to oscillate. The train of pulses at random intervals which is being outputted from the random pulse generating circuit at this time minimizes the effect of noise on the positive feedback loop. Consequently, the positive feedback loop does not suffer noise and hence oscillates at a stable period without being affected by the period of noise.

The above and other objects, features, and advantages of the present invention will become apparent from the following description with reference to the accompanying drawings which illustrate an example of the present invention.

DETAILED DESCRIPTION OF THE PREFERRED EMBODIMENT

Figure 1:
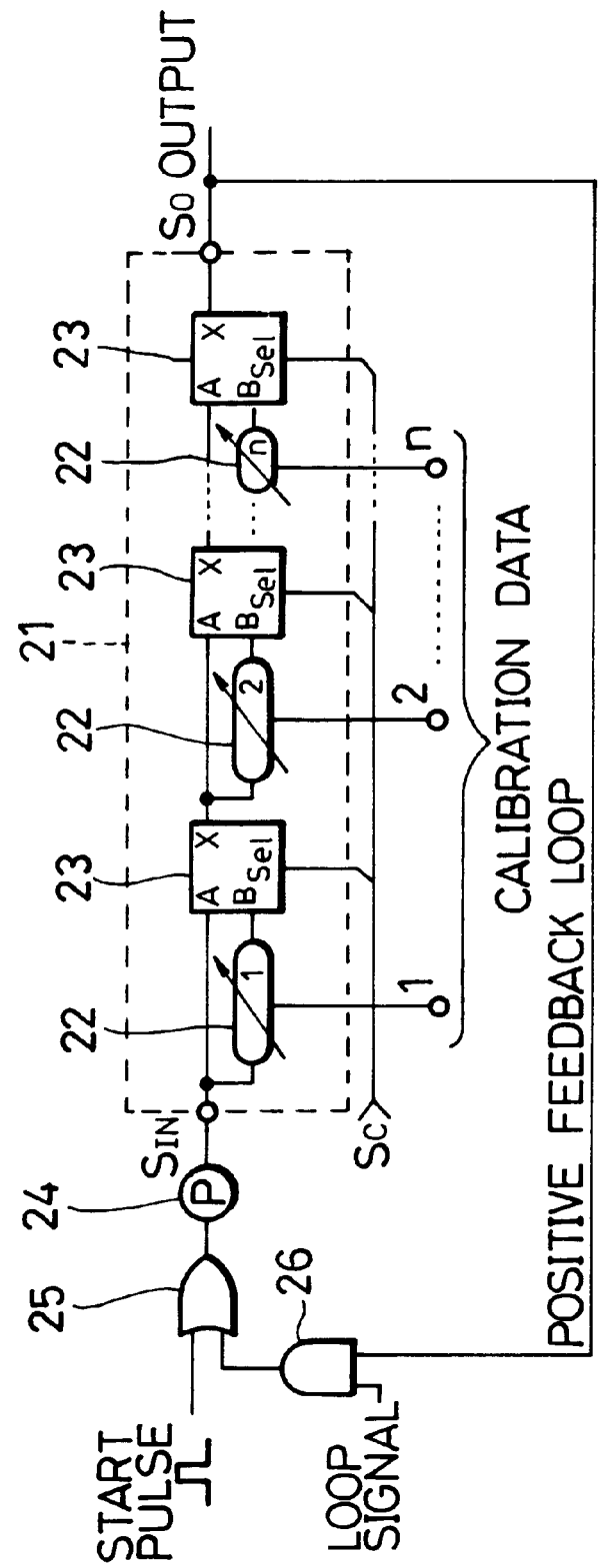
FIG. 1 is a block diagram of a circuit arrangement used in a conventional method of measuring a delay time.
Figure 1:
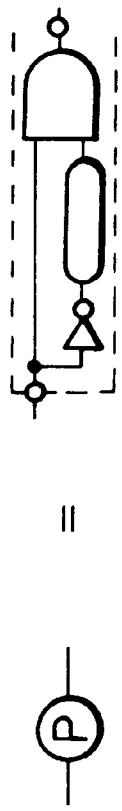

In the circuit arrangement shown in FIG. 1 which is used in the conventional method of measuring a delay time, a single start pulse is used to trigger the positive feedback loop to start to oscillate. According to the present invention, a random pulse train generating circuit for producing a train of pulses at random intervals is added to the conventional circuit arrangement, and pulses outputted from the random pulse train generating circuit are applied to the positive feedback loop to cause the latter to oscillate.

Figure 2:
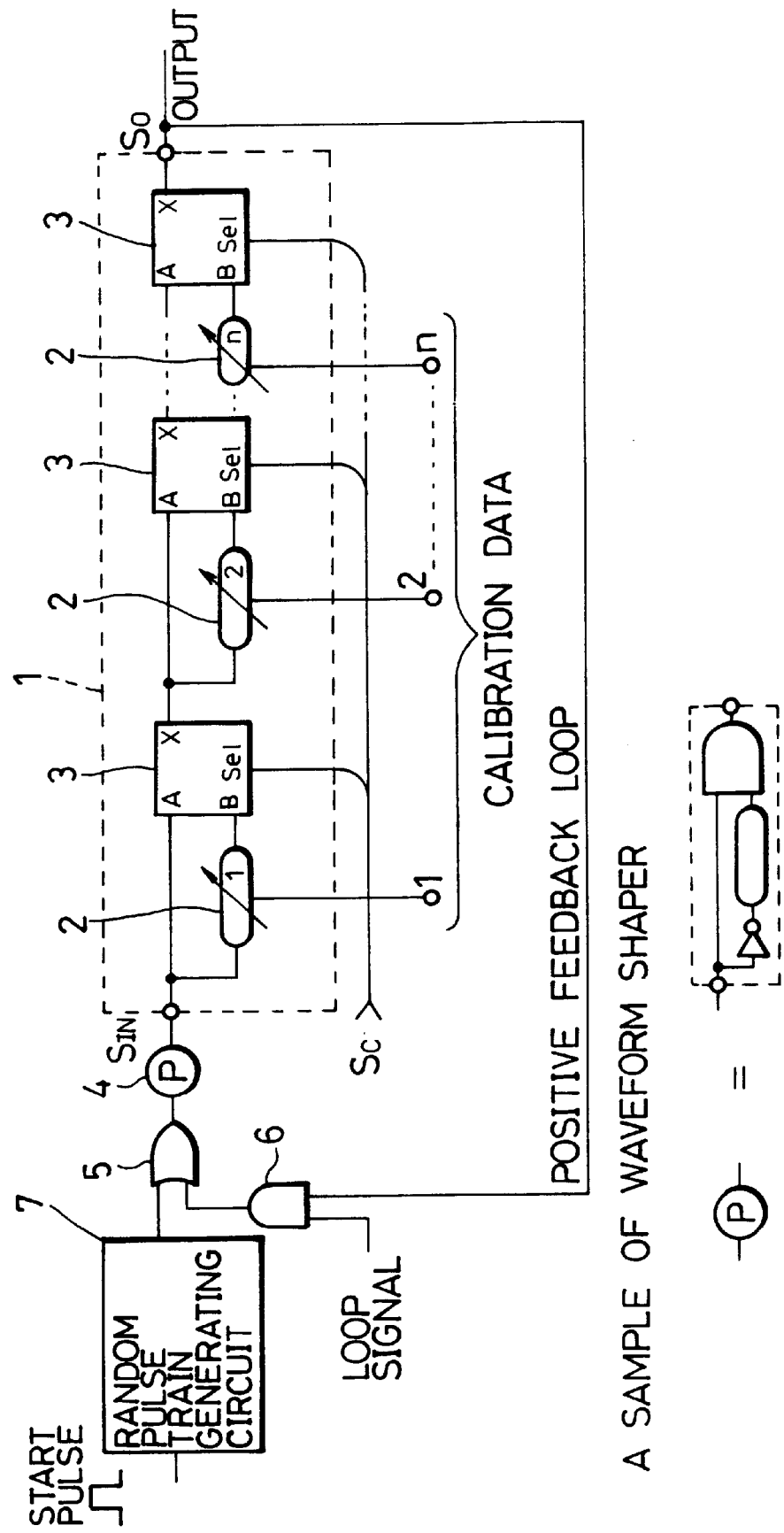
FIG. 2 is a block diagram of a circuit arrangement used in a method of measuring a delay time according to the present invention.

As shown in FIG. 2, a delay time generating circuit 1 according to the present invention comprises n variable-delay circuits 2 whose delay time is established by binary data and n selectors 3 for selecting the respective variable-delay circuits 2. Each of the selectors 3 selects one of the input signals supplied to its two respective terminals, e.g., a terminal A and a terminal B, in response to a selection control signal Sc transmitted from a controller (not shown), and outputs the selected input signal from a terminal X thereof. The terminal A of each of the selectors 3 is supplied with an output signal directly from a preceding circuit, and the terminal B thereof is supplied with the same output signal through the corresponding variable-delay circuit 2. When the selectors 3 are selectively operated, corresponding variable-delay circuits 2 which have desired delay times, among all the n variable-delay circuits 2, are connected in series with each other, setting the entire delay time generating circuit 1 to a certain total delay time. The delay times of the variable-delay circuits 2 are determined by calibration data transmitted from the controller.

The delay time generating circuit 1 produces an output signal SO which is applied back to an input signal SIN thereof through a positive feedback loop comprising an AND gate 6, an OR gate 5, and a waveform shaper 4. The AND gate 6 is supplied with a loop signal for turning on or off the positive feedback loop, as an input signal in addition to the output signal SO. The OR gate 5 is supplied with output pulses from a random pulse train generating circuit 7 which produces a train of pulses at random intervals.

Figure 3:
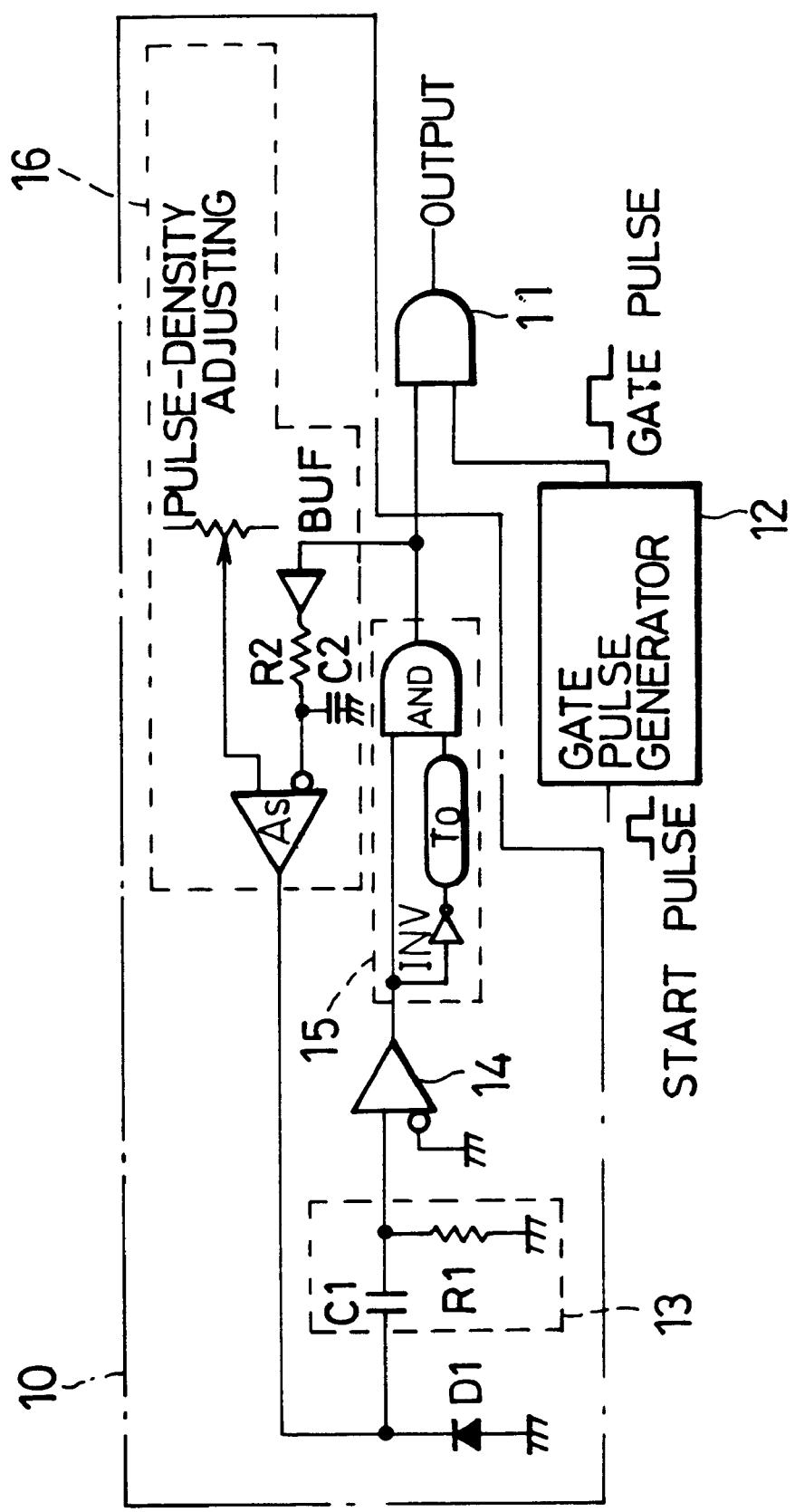
FIG. 3 is a circuit diagram, partly in block form, of a random pulse train generating circuit in the circuit arrangement shown in FIG. 2.

As shown in FIG. 3, the random pulse train generating circuit 7 comprises a random pulse oscillator 10 for producing a train of pulses at random intervals, a gate circuit 11 for controlling of the passage of a train of pulses outputted from the random pulse oscillator 10, and a gate pulse generator 12 for outputting a gate pulse which opens the gate circuit 11 to pass a train of pulses outputted from the random pulse oscillator 10.

The random pulse oscillator 10 comprises a diode D1 which is a noise source, a differential amplifier 13 comprising a capacitor C1 and a resistor R1 for extracting a noise signal from an output signal of the diode D1, a comparator 14 for shaping an output signal from the differential amplifier 13 into a pulse, a pulse-duration setting circuit 15 comprising an inverter INV, a delay circuit To, and an AND gate AND, for converting the pulse outputted from the comparator 14 into a pulse having a predetermined duration, and a pulse-density adjusting circuit 16 for adjusting the density of produced pulses, the pulse-density adjusting circuit 16 comprising a buffer BUF, an integrator composed of a resistor R2 and a capacitor C2, a variable resistor for adjusting a pulse density, and a differential amplifier As.

The pulse-duration setting circuit 15 has an output terminal connected to the pulse-density adjusting circuit 16, and the pulse-density adjusting circuit 16 has an output terminal connected to the diode D1, making up a negative feedback loop. The random pulse oscillator 10 starts to output a train of pulses at random intervals at the same time that it is switched on. The quantity of a signal which is fed back through the negative feedback loop is adjusted by the variable resistor for adjusting a pulse density in the pulse-density adjusting circuit 16, for thereby adjusting the density of a train of pulses outputted from the random pulse oscillator 10.

The gate pulse generator 12 generates a gate pulse having a predetermined duration (time) in response to single start pulse inputted thereto. The gate circuit 11 outputs a train of pulses outputted from the random pulse oscillator 10 to the OR gate 5 during the duration of the gate pulse which is supplied from the gate pulse generator 12 to the gate circuit 11.

When a loop signal of a high level is supplied to the AND gate 6, an output signal SO of the delay time generating circuit 1 is applied to an input signal SIN thereof through the positive feedback loop. In response to a start pulse, the random pulse train generating circuit 7 outputs a train of pulses at random intervals. The positive feedback loop of the delay time generating circuit 1 is now triggered to start to oscillate by the train of pulses supplied to the OR gate 5. Since the train of pulses at random intervals is applied to the positive feedback loop of the delay time generating circuit 1, the positive feedback loop does not suffer noise and hence oscillates at a stable period without being affected by the period of noise. Consequently, the delay time of the delay time generating circuit 1 can accurately be measured.

After the delay time of the delay time generating circuit 1 has been measured, the loop signal supplied to the AND gate 6 is set to a low level, causing the positive feedback loop to stop oscillating.

While the random pulse generating circuit 7 is illustrated as comprising the circuit arrangement shown in FIG. 3, the random pulse generating circuit 7 is not limited to the illustrated details, but may be of any other circuit arrangements insofar as it is capable of generating a train of pulses at random intervals.

It is to be understood that although the characteristics and advantages of the present invention have been set forth in the foregoing description, the disclosure is illustrative only, and changes may be made in the arrangement of the parts within the scope of the appended claims.

What is claimed is:

1. A method of measuring a delay time eliminating measurement error of a delay time generating circuit which delays an inputted pulse signal for a predetermined time and outputs the delayed pulse signal, comprising the steps of:

providing a random pulse generating circuit for outputting a train of pulses at random intervals;

applying an output signal of the delay time generating circuit to an input signal thereof through a positive feedback loop;

applying an output signal from said random pulse generating circuit to said positive feedback loop to cause the positive feedback loop to oscillate in order to thereby eliminate measurement error caused by interference in said delay time generating circuit; and determining a delay time of said delay time generating circuit from a period at which said positive feedback loop oscillates.

2. A random pulse train generating circuit comprising:

a random pulse oscillator for generating a train of pulses at random intervals;

a gate circuit for controlling the passage of the train of pulses outputted from said random pulse oscillator; and a gate pulse generator for outputting a gate pulse to open said gate circuit to pass the train of pulses outputted from said random pulse oscillator; said random pulse oscillator comprising;
 a noise source;
 a differential amplifier for extracting a noise signal from an output signal of said noise source;
 a comparator for shaping an output signal from said differential amplifier into a pulse;
 a pulse-duration setting circuit for converting the pulse outputted from said comparator into a pulse having a predetermined duration; and
 a pulse-density adjusting circuit having adjusting means for supplying an output signal from said pulse-duration setting circuit to said noise source through a negative feedback loop thereby to enable said pulse-duration setting circuit to output a train of pulses at random intervals, and adjusting the quantity of the signal through said negative feedback loop to adjust the density of the trail of pulses to provide stability of operation despite fluctuation of ambient temperature or of power-supply source voltage.

* * * * *